(12) United States Patent
Barsukou

(10) Patent No.: US 12,538,080 B2
(45) Date of Patent: Jan. 27, 2026

(54) PIEZOELECTRIC MICROELECTROMECHANICAL SYSTEM MICROPHONE

(71) Applicant: Skyworks Solutions, Inc., Irvine, CA (US)

(72) Inventor: Siarhei Dmitrievich Barsukou, Takarazuka (JP)

(73) Assignee: Skyworks Solutions, Inc., Irvine, CA (US)

( * ) Notice: Subject to any disclaimer, the term of this patent is extended or adjusted under 35 U.S.C. 154(b) by 237 days.

(21) Appl. No.: 18/370,017

(22) Filed: Sep. 19, 2023

(65) Prior Publication Data

US 2024/0098426 A1 Mar. 21, 2024

Related U.S. Application Data

(60) Provisional application No. 63/408,212, filed on Sep. 20, 2022.

(51) Int. Cl.
 *H04R 17/02* (2006.01)
 *H10N 30/067* (2023.01)
 *H10N 30/074* (2023.01)

(52) U.S. Cl.
 CPC ........... *H04R 17/02* (2013.01); *H10N 30/067* (2023.02); *H10N 30/074* (2023.02); *H04R 2201/003* (2013.01); *H04R 2499/11* (2013.01)

(58) Field of Classification Search
 CPC .. H10N 30/067; H10N 30/074; H10N 30/704; H10N 30/306; H04R 17/02; H04R 2201/003; H04R 2499/11; H04R 1/04; H04R 7/14; H04R 2410/03; H04R 7/06
 See application file for complete search history.

(56) References Cited

U.S. PATENT DOCUMENTS

| | | |
|---|---|---|
| 6,404,863 B1 | 6/2002 | Beamish |
| 6,768,914 B1 | 7/2004 | Garey |
| 9,055,372 B2 * | 6/2015 | Grosh ................. H04R 31/003 |
| 11,350,219 B2 | 5/2022 | Hui et al. |
| 11,533,567 B2 | 12/2022 | Hui et al. |
| 11,553,280 B2 | 1/2023 | Hui et al. |
| 11,606,646 B2 | 3/2023 | Hui et al. |

(Continued)

OTHER PUBLICATIONS

Yamashita et al., "Diaphragm deflection control of piezoelectric ultrasonic microsensors for sensitivity improvement" Sensors and Actuators, (2007), vol. A 139, pp. 118-123.

*Primary Examiner* — Brian Ensey
(74) *Attorney, Agent, or Firm* — Knobbe, Martens, Olson & Bear, LLP

(57) ABSTRACT

A piezoelectric microelectromechanical system microphone has a piezoelectric sensor layer with at least two sensing electrodes and at least one piezoelectric layer. Each piezoelectric layer can deform and generate an electrical potential responsive to impingement of sound waves on the piezoelectric layer. The sensing electrodes and the at least one piezoelectric layer form a stacked electrode structure. Each sensing electrode is disposed on or below a corresponding piezoelectric layer and senses the generated electrical potential. At least one of the sensing electrodes can include first corrugations which are configured such to release residual stress and to improve sensitivity of the microelectromechanical system microphone.

20 Claims, 10 Drawing Sheets

(56) References Cited

U.S. PATENT DOCUMENTS

| | | |
|---|---|---|
| 11,716,576 B2 | 8/2023 | Chen et al. |
| 2014/0339657 A1* | 11/2014 | Grosh .................... H04R 17/00 |
| | | 257/416 |
| 2016/0090300 A1* | 3/2016 | Tsai ....................... H04R 17/02 |
| | | 257/254 |
| 2022/0267141 A1 | 8/2022 | Chen et al. |
| 2022/0332568 A1 | 10/2022 | Barsukou |
| 2022/0402751 A1 | 12/2022 | Chen et al. |
| 2022/0408185 A1 | 12/2022 | Barsukou |
| 2022/0408195 A1 | 12/2022 | Barsukou |
| 2022/0408208 A1 | 12/2022 | Chen et al. |
| 2023/0007405 A1 | 1/2023 | Qian et al. |
| 2023/0011561 A1 | 1/2023 | Qian et al. |
| 2023/0012046 A1 | 1/2023 | Qian et al. |
| 2023/0039743 A1 | 2/2023 | Hui et al. |
| 2023/0072672 A1 | 3/2023 | Chen et al. |
| 2023/0081056 A1 | 3/2023 | Qian et al. |
| 2023/0092374 A1 | 3/2023 | Qian et al. |
| 2023/0104257 A1 | 4/2023 | Barsukou et al. |
| 2023/0105699 A1 | 4/2023 | Chen et al. |
| 2023/0114813 A1 | 4/2023 | Hui et al. |
| 2023/0121053 A1 | 4/2023 | Campanella-pineda et al. |
| 2023/0125523 A1 | 4/2023 | Qian et al. |
| 2023/0127983 A1 | 4/2023 | Chen et al. |
| 2023/0188896 A1 | 6/2023 | Barsukou et al. |
| 2023/0234837 A1 | 7/2023 | Chen et al. |
| 2023/0239641 A1 | 7/2023 | Chen et al. |
| 2023/0253007 A1 | 8/2023 | Sprunger et al. |
| 2023/0269524 A1 | 8/2023 | Chen et al. |
| 2023/0269525 A1 | 8/2023 | Chen et al. |
| 2023/0283962 A1 | 9/2023 | Hui et al. |
| 2023/0283963 A1 | 9/2023 | Chen et al. |
| 2023/0292045 A1 | 9/2023 | Wurtz et al. |

\* cited by examiner

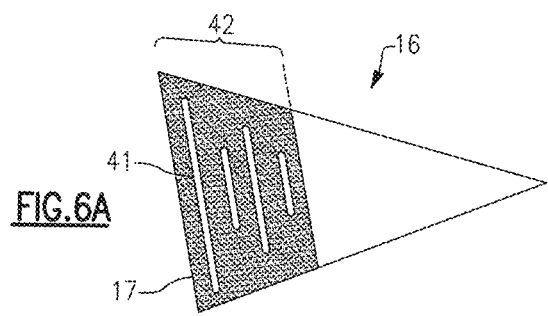
FIG.6A
FIG.6B
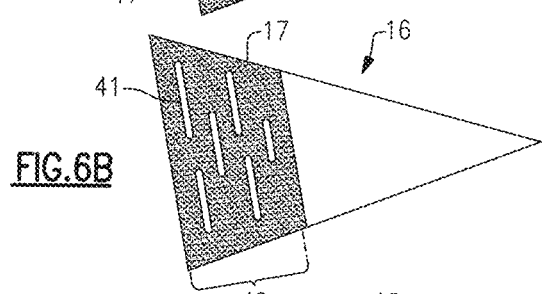
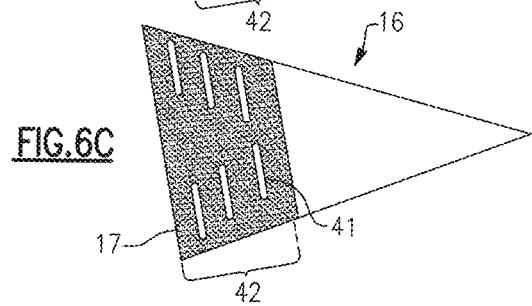
FIG.6C
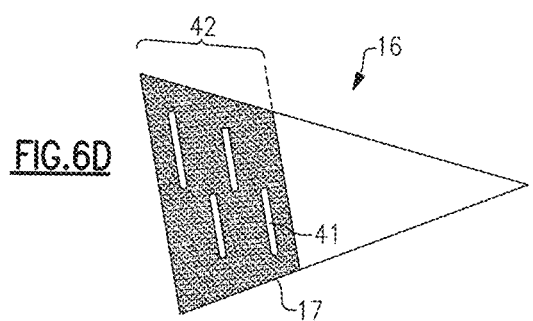
FIG.6D
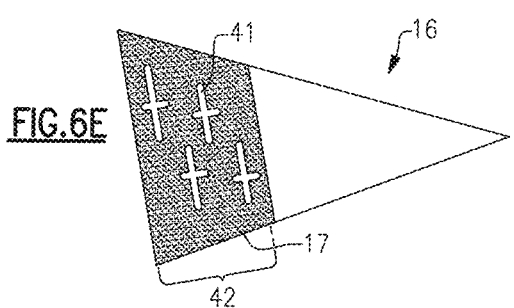
FIG.6E

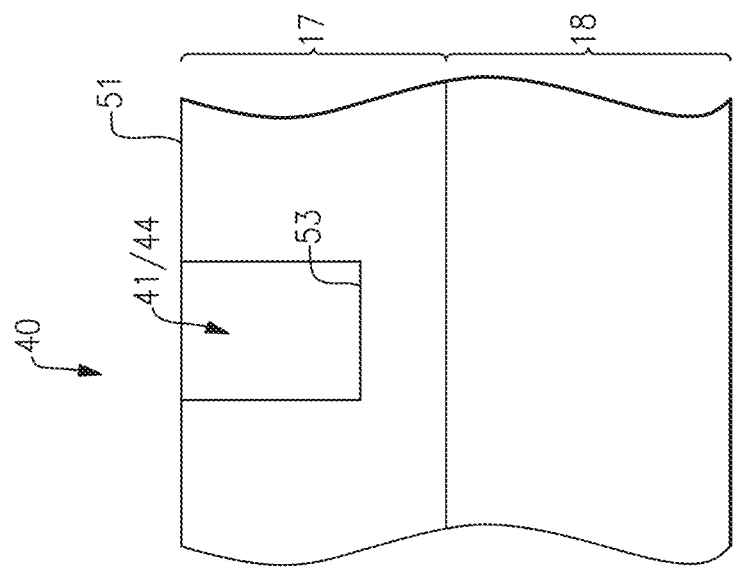
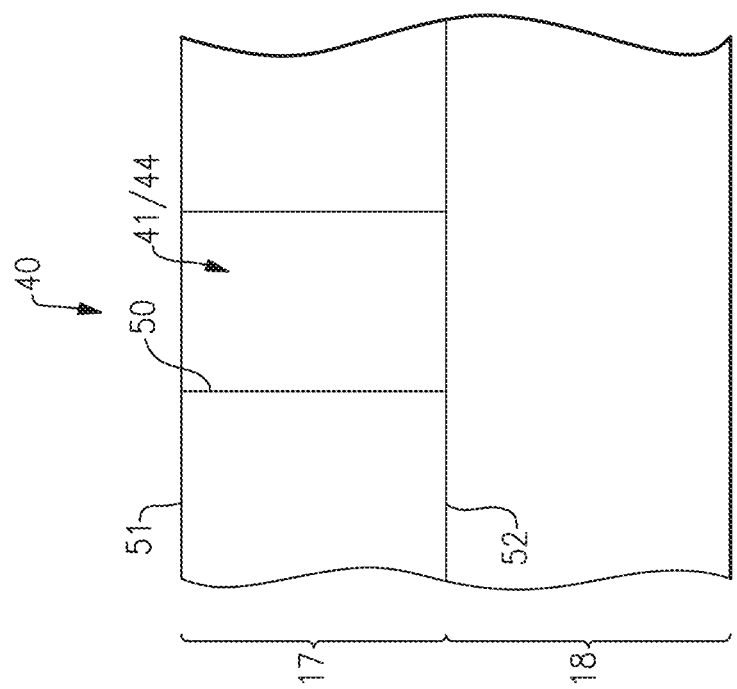

PIEZOELECTRIC MICROELECTROMECHANICAL SYSTEM MICROPHONE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Technical Field

Embodiments disclosed herein relate to piezoelectric microelectromechanical system microphones and to devices including the same.

Description of the Related Technology

A microphone is an electroacoustic transducer that converts sound into electric signals. It operates within audible range that is from 20 Hz to 20 kHz. Microphones are used in many applications such as smartphones, computers, smart system for automation and control, speech recognitions, VoIP-systems and for non-acoustic purposes such as ultrasonic sensors. Several types of microphones are used today, which employ different methods to convert the air pressure variations of a sound wave to an electrical signal.

The so-called microelectromechanical systems (MEMS) microphone is a micro-machined electromechanical device that is configured to convert sound pressure (e.g., voice sound) to an electrical signal (e.g., voltage). MEMS microphones are widely used in mobile devices, such as cell phones, headsets, smart speakers and other voice-interface devices or systems. Capacitive MEMS microphones and piezoelectric MEMS microphones are both available in the market. Piezoelectric MEMS microphones require no bias voltage for operation; therefore, they provide lower power consumption than capacitive MEMS microphones. The single membrane structure of piezoelectric MEMS microphones enables them to generally provide more reliable performance than capacitive MEMS microphones when used in a harsh environment (e.g., when exposed to dust and/or water).

The present disclosure is directed specifically to such piezoelectric MEMS microphones, which employ a crystal of piezoelectric material for sensing the sound pressure.

Existing piezoelectric MEMS microphones are based either on cantilever MEMS structures or on diaphragm MEMS structures. Piezoelectric MEMS microphones based on diaphragm structures may suffer from sensitivity variation and degradation if residual stress causes large tensile or compression stress to be present within the diaphragm. Cantilever based piezoelectric MEMS structure suffer from poor low-frequency roll-off control as the gap between adjacent cantilevers varies due to cantilever deflection induced by residual stress.

SUMMARY OF THE INVENTION

In some aspects, the techniques described herein relate to a microelectromechanical microphone including: a substrate; a sensor layer supported by the substrate, the sensor layer including at least two sensing electrodes and at least one piezoelectric layer, the at least two sensing electrodes and the at least one piezoelectric layer stacked together to form a stacked electrode structure, the at least one piezoelectric layer configured to deform and generate an electrical potential responsive to impingement of sound waves on the at least one piezoelectric layer, the at least two sensing electrodes configured to sense the electrical potential, and at least one sensing electrode of the at least two sensing electrodes including first corrugations which are configured such to release residual stress and to improve sensitivity of the microelectromechanical microphone.

In some aspects, the techniques described herein relate to a microelectromechanical microphone wherein the first corrugations are defined as one or more trenches.

In some aspects, the techniques described herein relate to a microelectromechanical microphone wherein at least one trench of the one or more trenches extends partially through the at least one sensing electrode.

In some aspects, the techniques described herein relate to a microelectromechanical microphone where a depth of the at least one trench is at least as deep as a width of the at least one trench.

In some aspects, the techniques described herein relate to a microelectromechanical microphone wherein at least one of the one or more trenches extends completely through the at least one sensing electrode.

In some aspects, the techniques described herein relate to a microelectromechanical microphone wherein a width of the one or more trenches is between 100 nm and 10 μm.

In some aspects, the techniques described herein relate to a microelectromechanical microphone wherein the first corrugations are defined as one or more thinned portions within the at least one sensing electrode.

In some aspects, the techniques described herein relate to a microelectromechanical microphone wherein the first corrugations are arranged at an outer area of the at least one sensing electrode with respect to a center of the sensor layer.

In some aspects, the techniques described herein relate to a microelectromechanical microphone wherein portions of the sensor layer which are covered by the at least one sensing electrode form an active region of the sensor layer, the first corrugations being provided within a pattern across the active region.

In some aspects, the techniques described herein relate to a microelectromechanical microphone wherein the pattern represents an array of slit-like trenches or thinned portions that are arranged in parallel to each other.

In some aspects, the techniques described herein relate to a microelectromechanical microphone wherein the pattern represents an array of slit-like trenches or thinned portions that are arranged equidistant to a center of the sensor layer.

In some aspects, the techniques described herein relate to a microelectromechanical microphone wherein the pattern represents an array of crossed-like trenches or thinned portions.

In some aspects, the techniques described herein relate to a microelectromechanical microphone wherein the active region extends in a ring shape or as a ring section around a center of the sensor layer.

In some aspects, the techniques described herein relate to a microelectromechanical microphone wherein areas of the sensor layer to which the at least two sensing electrodes to not extend form a passive region of the sensor layer, the microelectromechanical microphone further including second corrugations which are provided in the passive region of the sensor layer.

In some aspects, the techniques described herein relate to a microelectromechanical microphone wherein the sensor layer is attached to the substrate about a perimeter of the sensor layer and includes a plurality of sensor segments all of which include the stacked electrode structure.

In some aspects, the techniques described herein relate to a microelectromechanical microphone wherein all sensor segments within the sensor layer includes first corrugations.

In some aspects, the techniques described herein relate to a microelectromechanical microphone wherein the sensor layer includes a plurality of cantilever-type sensor segments.

In some aspects, the techniques described herein relate to a microelectromechanical microphone wherein the microelectromechanical microphone includes a diaphragm structure.

In some aspects, the techniques described herein relate to a microelectromechanical microphone wherein the at least two sensing electrodes include an inner sensing electrode disposed proximate a center of the diaphragm structure and an outer sensing electrode disposed proximate a perimeter of the diaphragm structure.

In some aspects, the techniques described herein relate to a microelectromechanical microphone wherein the inner sensing electrode and the outer sensing electrode include the first corrugations.

In some aspects, the techniques described herein relate to a microelectromechanical microphone wherein the first corrugations are configured such to release residual stress and to improve sensitivity of the microelectromechanical microphone.

In some aspects, the techniques described herein relate to an electronic device module including at least one microelectromechanical microphone with a piezoelectric sensor layer, the piezoelectric sensor layer including: at least two sensing electrodes; and at least one piezoelectric layer, each piezoelectric layer being configured to deform and generate an electrical potential responsive to impingement of sound waves on the at least one piezoelectric layer, the at least two sensing electrodes and the at least one piezoelectric layer forming a stacked electrode structure, each sensing electrode being disposed on or below a corresponding piezoelectric layer and configured to sense the electrical potential, and at least one of the at least two sensing electrodes including first corrugations which are configured such to release residual stress and to improve sensitivity of the at least one microelectromechanical microphone.

In some aspects, the techniques described herein relate to an electronic device including the electronic device module.

In some aspects, the techniques described herein relate to a wireless device including the electronic device module.

In some aspects, the techniques described herein relate to a method of forming a piezoelectric microelectromechanical system microphone, the method including: providing a support substrate; depositing a film of piezoelectric material on the support substrate to form a piezoelectric sensor layer, the piezoelectric sensor layer secured to the support substrate about a perimeter of the piezoelectric sensor layer and including a central region defined within the perimeter that is free to deform and generate an electrical potential responsive to impingement of sound waves on the film of piezoelectric sensor layer; forming sensing electrodes on one or both of upper and lower surfaces of the piezoelectric sensor layer; and forming first corrugations in the sensing electrodes.

In some aspects, the techniques described herein relate to a method wherein forming the first corrugations includes forming one or more trenches or thinned portions on or in the sensing electrodes.

In some aspects, the techniques described herein relate to a method wherein at least the first corrugations are produced by employing a wet etch or dry etch process on a surface of a corresponding sensing electrodes.

In some aspects, the techniques described herein relate to a method wherein at least the first corrugations are produced by diamond sawing or by laser welding a surface of a corresponding sensing electrodes.

These and other aspects of the disclosure will become apparent from and elucidated with reference to the embodiments described hereinafter.

BRIEF DESCRIPTION OF THE DRAWINGS

Embodiments of this disclosure will now be described, by way of non-limiting example, with reference to the accompanying drawings.

FIGS. 6A-6E show different designs for the slit line or trench designs of the corrugation structure;

FIGS. 7A-7E show different trench-designs for the corrugation structure;

DETAILED DESCRIPTION OF CERTAIN EMBODIMENTS

Figure 1A:
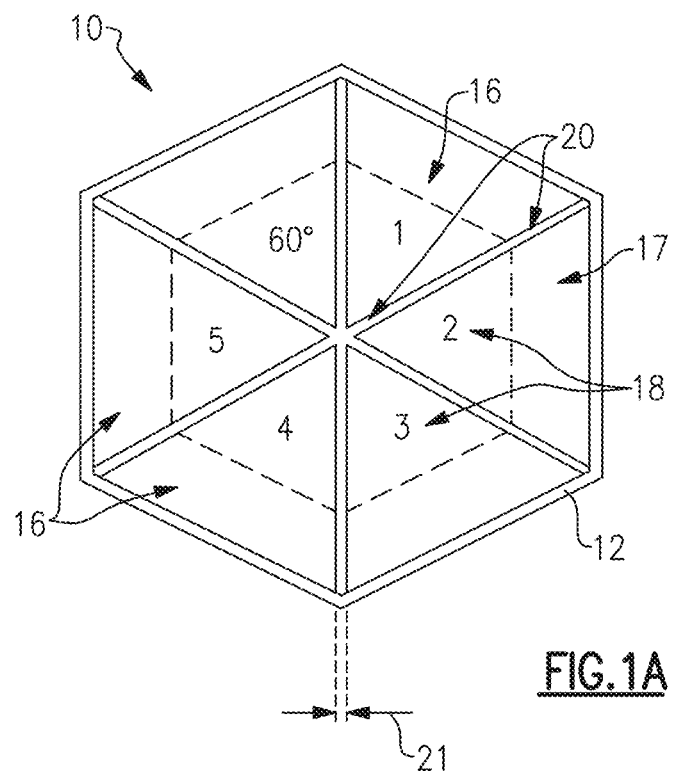
FIG. 1A shows a first embodiment of a piezoelectric microelectromechanical system (MEMS) microphone in a top view.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. Elements in the drawings are illustrated for simplicity and clarity and have not necessarily been drawn to scale.

Figure 1B:
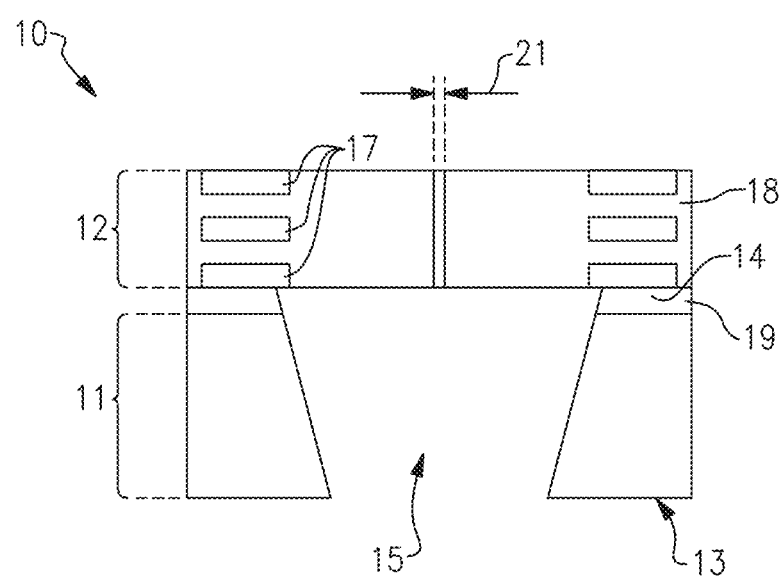
FIG. 1B shows the first embodiment of the piezoelectric MEMS microphone in a cross-section view.

FIGS. 1A and 1B show an embodiment of a piezoelectric microelectromechanical system (MEMS) microphone in a top view (FIG. 1A) and in a cross-section view (FIG. 1B).

The piezoelectric MEMS microphone is denoted by reference numeral 10. The piezoelectric MEMS microphone 10 comprises a substrate 11 and a sensor layer 12.

The substrate 11 includes a bottom surface 13 and a top surface 14. The substrate 11 is basically ring-shaped defining an opening 15 between the bottom end 13 of the substrate 11 and the top end 14 of the substrate 11. Ring-shaped in the context of this disclosure means a round or oval ring shape of the opening 15 and/or of the perimeter of the substrate 11, but can also include a polygonal or multi-angular shape, such as a square-ring or a hexagonal ring shape.

The sensor layer 12 is a piezoelectric sensor layer 12. The piezoelectric sensor layer 12 comprises a plurality of cantilever type sensor segments 16 that are attached to the substrate 11 about a perimeter of the sensor layer 12. Each sensor segment 16 includes a stacked electrode structure with at least two sensing electrodes 17 and with at least one piezoelectric layer 18. In the example of FIG. 1, the sensor layer 12 comprises six sensor segments 16 of the same size and shape.

Each piezoelectric layer 18 is configured to deform and generate an electrical potential responsive to an impingement of sound waves on the piezoelectric layer 18. The piezoelectric layer 18 comprises doped aluminum nitride (AlN), however, also other materials with piezoelectric properties may be used for the piezoelectric layer 18.

Each sensing electrode 17 is disposed on or below a corresponding piezoelectric layer 18. The sensing electrodes 17 are configured to sense the generated electrical potential generated by the piezoelectric layer 18 in response to received sound waves. The sensing electrode 17 comprises an alloy of molybdenum and titanium (Mo/Ti), however, also other materials with electric conductive properties may be used for the sensing electrode 17.

The cantilever type sensor segments 16 are arranged side by side and are further configured such to form a honeycomb sensor structure. In the example of FIG. 1, the six sensor segments 16 of the honeycomb structure form corresponding triangles or triangle-shaped segments of equal size.

Between the substrate 11 and the sensor layer 12 an isolation layer 19 is provided for isolating the sensor layer 12 from the substrate 11. The isolation layer 19 is placed on the top surface 14 of the substrate 11. In the embodiment of FIG. 1, the isolation layer 19 is formed of a thermally grown silicon dioxide (SiO2), however, also epitaxially deposited silicon dioxide, silicon nitride (Si3N4) or any other isolating layer may be possible.

In the example of FIG. 1, the sensor segments 16 are distanced to each other to form a gap 20 between adjacent sensor segments 16. The gap 20 in particular serves for better ventilation and pressure compensation of the MEMS microphone 10. The width 21 of the gaps 20 between adjacent sensor elements 16 is preferably is in the range between 1 nm and 20 nm. Preferable the gap is as below 10 nm. The gap 20 should be as small or narrow as possible in order to safely separate the segments 16 from each other, but large enough not to risk a short circuit or contact between adjacent segments 16 and to allow sufficient ventilation and pressure compensation. The width 21 of the gaps 20 is therefore mostly technology-dependent as well as dependent on the size of the piezoelectric MEMS microphone 10 and the edge lengths of the respective segments 16.

Using the features and principles disclosed herein, the sensing electrode 17 within the sensor layer 12 includes a corrugation structure (not explicitly shown in FIGS. 1A and 1B) to increase compliance and sensor performance. The design, arrangement and special features of this corrugation structure will be described in more detail below with reference to FIGS. 4 to 7E.

Figure 2:
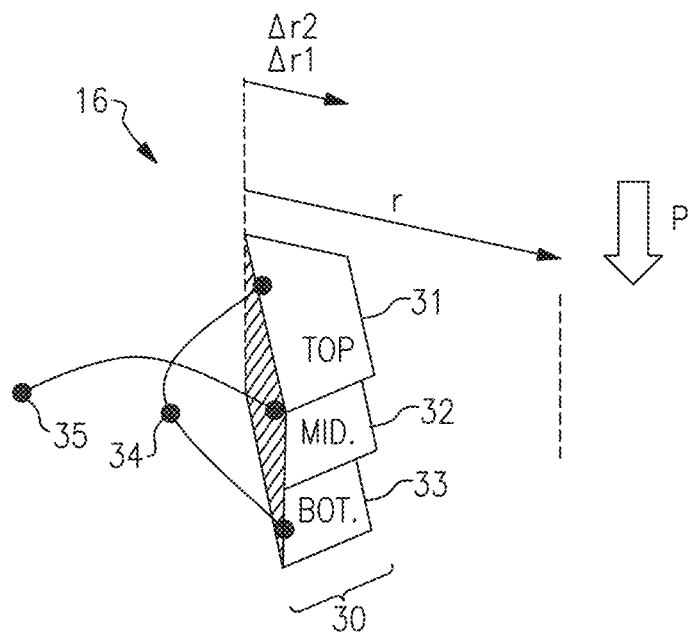
FIG. 2 shows a first example of a single sensor segment of a MEMS microphone as illustrated in FIGS. 1A, 1B

FIG. 2 shows an embodiment of a single sensor segment of a MEMS microphone as illustrated in FIGS. 1A, 1B. The cantilever type sensor segment 16 comprises a sectorized sensor cell 30 which covers only part of the whole sensor segment 16 at its perimeter side. While FIG. 2 shows only one sectorized sensor cell 30 with the same sensor segment 16, a sensor segment may also comprise a plurality of adjacently arranged sectorized sensor cells 30.

The sensor segment 16 has the shape of an isosceles triangle with two equal sides which correspond to the radius r of the honeycomb structure. The sensing electrodes 31-33 within the sensor segment 16 are arranged at the perimeter side of a corresponding sensor segment 16 and are extending only partially from its perimeter side towards the center of the sensor layer 12.

The sectorized sensor cell 30 within the sensor segment 16 comprises three electrode layers with top electrode 31, middle electrode 32 and bottom electrode 33. The electrode layers 31-33 form the sensor electrodes 17, which are part of the stacked electrode structure. Between the electrode layers 31-33 and outside their expansion, there is the piezoelectric material of the piezoelectric layers 18 (not explicitly illustrated in FIG. 2 for sake of clarity).

The segment radius of the sensor segment 16 is denoted by r and the radial expansion of the sectorized sensor cell 30 and their three electrode layers 31-33, respectively, are denoted by $\Delta r1$, $\Delta r2$, wherein $\Delta r1$ refers to the radial expansion of the middle electrode 32 and wherein $\Delta r2$ refers to the radial expansion of the top and bottom electrodes 31, 33. Thus, in the example shown in FIG. 2, all electrode layers 31-33 have the same size and shape and are arranged in a stacked manner without lateral overlap. All electrode layers 31-33 have the same radial expansion inwards towards the center of the MEMS microphone 10 such that the radial expansions of all electrode layers 31-33 is $\Delta r1 = \Delta r2$.

The radius may be 400 nm and the radial expansions $\Delta r1 = \Delta r2$ is in the range of 0.15 and 0.35 of the segment radius r. Preferably, the radial expansions is in this example $\Delta r1 = \Delta r2 = 0.26$.

In the example of FIG. 2, the top and bottom electrodes 31, 33 are connected to a terminal 34 to which the reference ground is applied. The middle electrode 32 is connected to an output terminal 34 for providing an output signal of the sensor segment 16.

Figure 3:
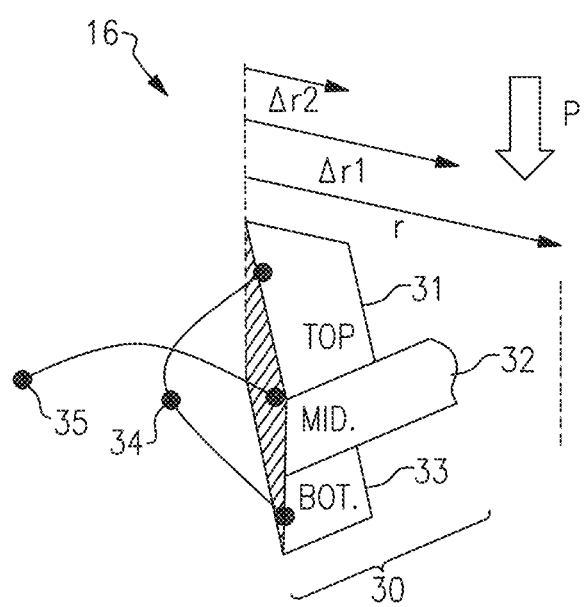
FIG. 3 shows a second example of a single sensor segment of a MEMS microphone as illustrated in FIGS. 1A, 1B.

FIG. 3 shows a further embodiment of a single sensor segment 16 of a MEMS microphone 10 as illustrated in FIGS. 1A, 1B. Unlike the embodiment of FIG. 2, the embodiment shown in FIG. 3 includes electrode layers 31-33 which do not all have the same size and shape. In particular, the middle electrode 32 is larger than the top and bottom electrode 31, 33 within the same sensor segment 16. The middle electrode 32 is overlapping the top and bottom electrodes 31, 33 such that it is extending more proximate to the center of the sensor segment 16 than the top and bottom electrodes 31, 33. In the example of FIG. 3, the radial expansion Δr1 of the middle electrode 32 is greater than the radial expansions Δr2 of the top and bottom electrodes 31, 33 such that Δr1>Δr2.

The radial expansion Δr2 of the top and bottom sensing electrodes 31, 32 is in the range between 0.2 and 0.3 of the segment radius r. The radial expansion Δr1 of the middle sensing electrode 32 is in the range of 0.45 and 0.55 of the segment radius r.

Figure 4:
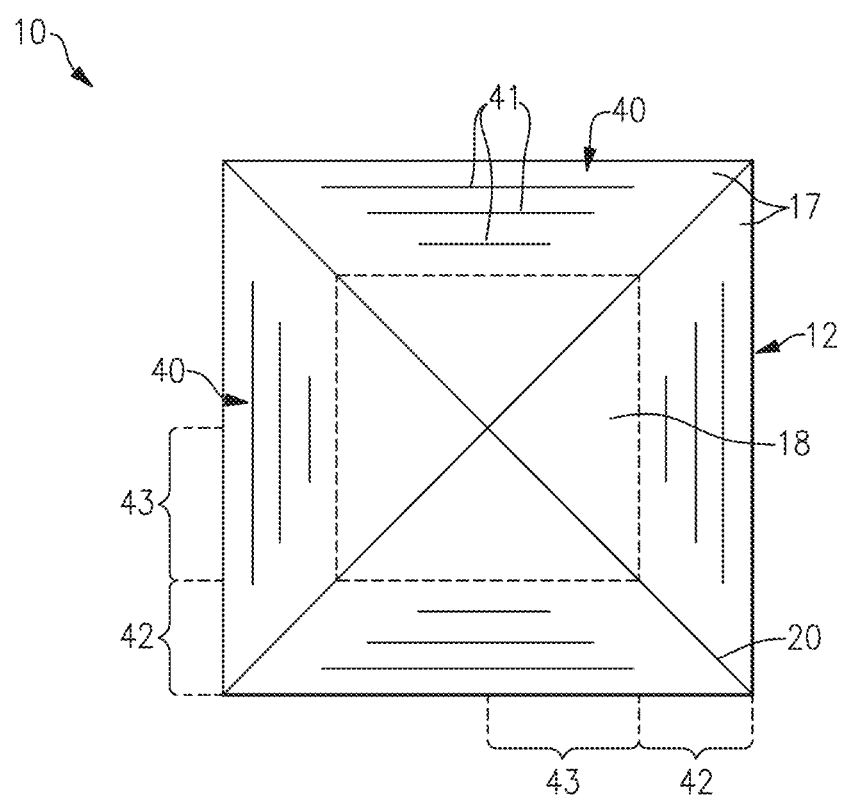
FIG. 4 shows a further embodiment of the MEMS microphone in a top view.

FIG. 4 shows the MEMS microphone 10 in a top view according to an embodiment. Unlike to the MEMS microphone 10 in FIG. 1A, the MEMS microphone 10 in FIG. 4 has a square structure, however, other designs, such as a rectangular, circular or oval design, may be used as well.

According to the invention, the MEMS microphone 10 in FIG. 4 comprises a corrugation structure 40 which are illustrated as slit lines 41 in FIG. 4. The corrugation structure 40 is provided in the sensing electrodes 17 only, which defines an active region 42. The areas in the sensor layer 12 outside the sensing electrode 17, i.e. the areas within the piezoelectric sensor layer 12 which are not covered by the sensing electrode 17, define a passive region 43. In the example in FIG. 4, no corrugation structure is provided in the passive region 43, however, it would also be advantageous to use further corrugations in the passive region 43 (not shown in FIG. 4).

The narrower the slit lines 41 are, the more the reduction of the active area 42 is restricted and output electrical parameters of the sensing electrode 17 improves.

Figure 5A:
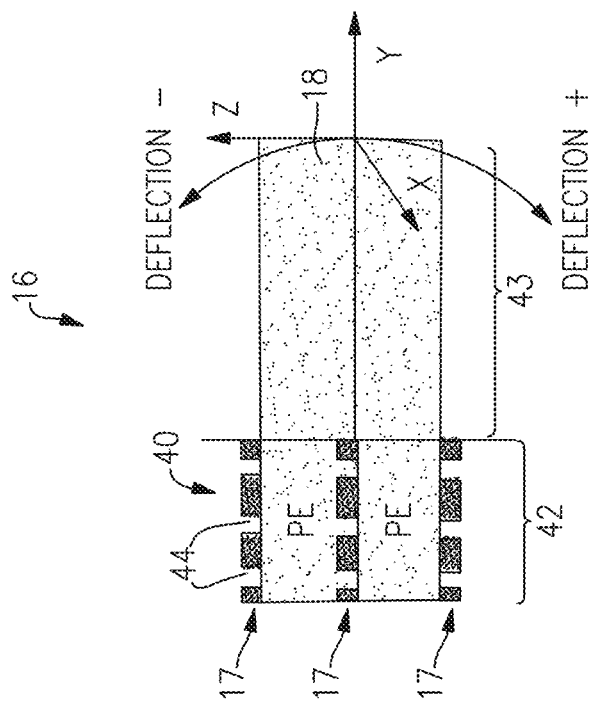
FIG. 5A shows a further example of a single sensor segment of a MEMS microphone as illustrated in FIG. 4 in a perspective view.
Figure 5B:
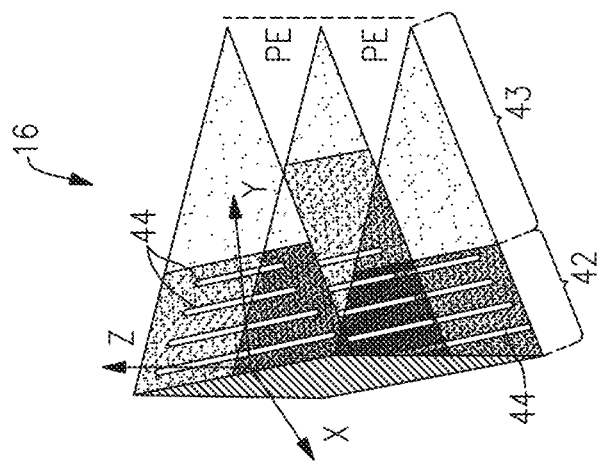
FIG. 5B shows the further example of the single sensor segment of a MEMS microphone as illustrated in FIG. 4 in a cross-section view.

FIGS. 5A and 5B show a further example of a single sensor segment 16 of a MEMS microphone in a perspective view (FIG. 5A) and in a cross-section view (FIG. 5B).

The sensor segment 16 comprises a corrugation structure 40 in the form of trenches 44. These trenches 44 are provided only in the active region 42 and as such in the sensing electrodes 17. The trenches 44 are formed by dry or wet etching of the metal electrodes at the active region 42 by employing a suitable lithography process. In the example of FIGS. 5A and 5B, the trenches 44 go completely through the material of the sensing electrode 17, vertically and perpendicularly, but do not extend into the piezoelectric layer 18 directly above or under the corresponding sensing electrode 17.

In another example (not shown in FIGS. 5A and 5B), the trenches are extending into the piezoelectric layer 18 directly above or under the corresponding sensing electrode 17.

In general, it can be said that the trenches 44 are aligned according to the direction of deflection of the sensor segment 16 or which are perpendicular to the cantilever beam direction (Y-axis).

FIGS. 6A to 6E show different designs for the slit lines 41 of the corrugation structure 40 within the active region 42.

In FIG. 6A, the slit lines 41 are arranged parallel to each other, transversely in the radial direction with respect to a center 46 of the segment 16. Further, the slit lines 41 are arranged equidistant to each other. The slit lines 41 each have the same or basically the slit line width, but are of different lengths, with long slit lines 41 alternating with short slit lines 41. The long slit lines 41 extend over almost the entire width of the sensing electrode 17 or segment 16, respectively.

In contrast to the design illustrated in FIG. 6A, in FIG. 6B the long slit lines 41 are un-interrupted, so that in each case one long slit line 41 is formed by two short slit lines 41. This results in a slit line design in which the parallel slit lines 41 are of approximately equal length and are arranged offset from one another.

In the example of FIG. 6C, all slit lines 41 have the same length. In this case, the slit lines 41 are arranged to be the same distance from the lateral edge 45 of the active region 42, resulting in an approximately V-shaped design for the slit line arrangement that tapers toward the center 46 of the segment 16 or piezoelectric sensor layer 12.

In the example of FIG. 6D, the slit lines 41 have the same length and are staggered such that the slit lines 41 are arranged alternately in the left and right regions of the active region 42.

In the example of FIG. 6E, the corrugation structure 40 has a plurality of crossed lines 47, i.e. transverse slits are still provided for the slits arranged parallel to each other.

The corrugation structure 40 shown with respect of FIGS. 6A to 6E represents a compliance improvement pattern. This compliance improvement pattern may be designed and optimized accordingly to the stress-charge distribution field for the actual sensor stack, geometry and configuration. The compliance improvement pattern allows improving the sensor performance without complicated additional process steps.

FIGS. 7A-7E show different trench-designs for the corrugation structure.

In the example of FIG. 7A, a slit line 41 or trench 44 of the corrugation structure 40 is shown which passes completely through the sensing electrode 17. The trench walls 50 extend perpendicular to the surfaces 51, 52 of the sensing electrode 17 and extend from its upper surface 51 to its lower surface 52.

In contrast to the example in FIG. 7A, the slit line 41 or trench 44 of the corrugation structure 40 in FIG. 7B does not extend completely through the sensing electrode 17. Rather, the trench bottom 53 is in the middle of the material of the sensing electrode 17.

Figure 7C:
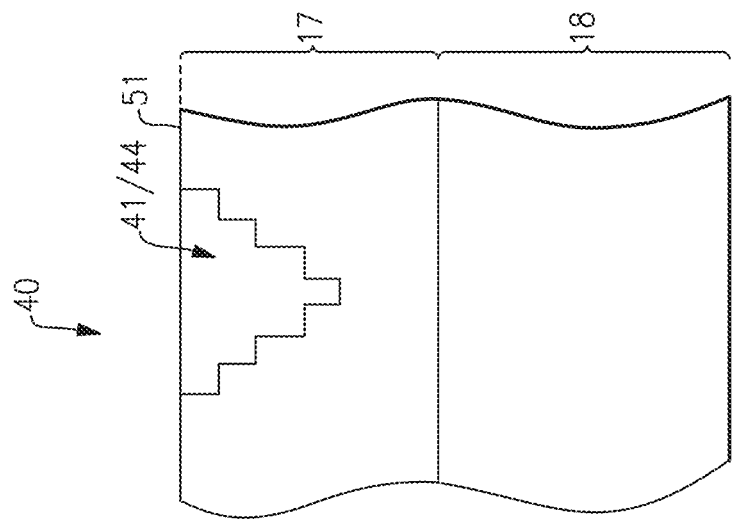

In contrast to the example in FIG. 7B, the slit 41 or trench 44 of the corrugation structure 40 in FIG. 7C does not extend perpendicularly into the sensing electrode 17. Rather, the cross-section of the trench 44 is here wedged-shaped or almost V-shaped.

Figure 7D:
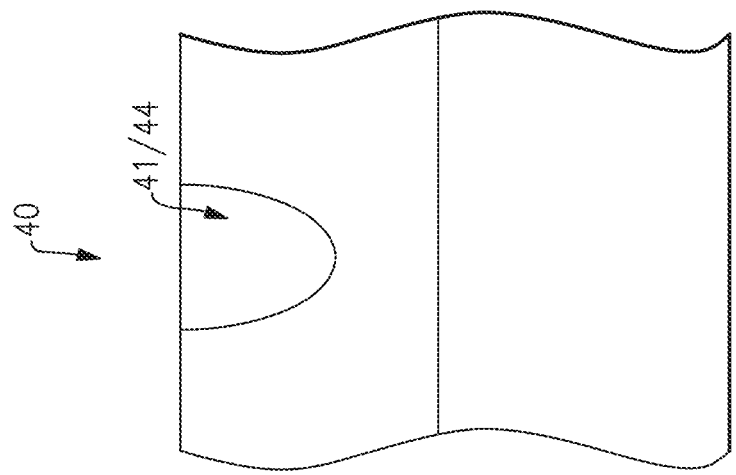

In contrast to the example in FIG. 7C, the cross-section of the trench 44 is U-shaped in FIG. 7D.

Figure 7E:
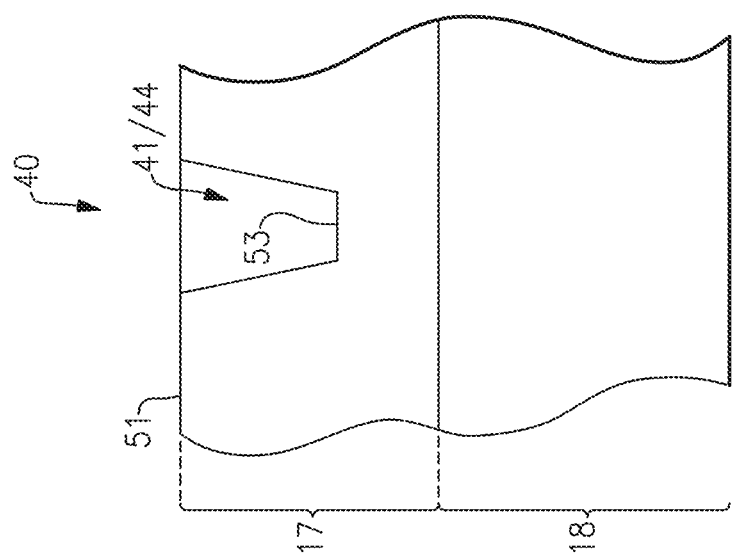

In contrast to the example in FIG. 7C, the cross-section of the trench 44 tapers gradually or stepwise in FIG. 7E.

Figure 8:
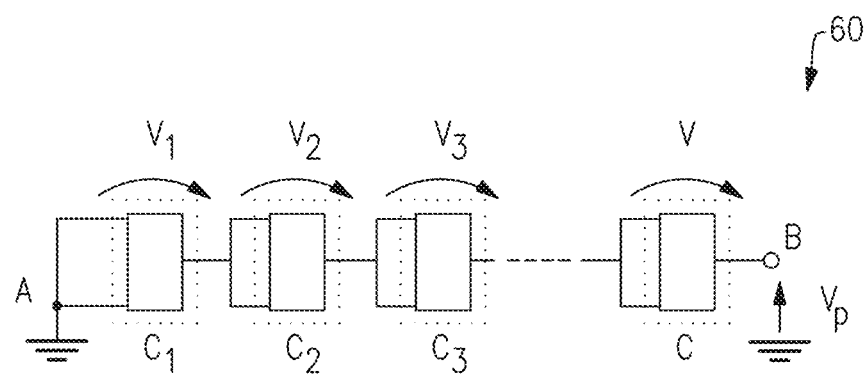
FIG. 8 shows an example of a circuit arrangement of the MEMS microphone as shown in FIGS. 1A, 1B.

FIG. 8 shows a circuit arrangement 60 of the MEMS microphone 10 as shown in FIGS. 1A, 1B according to an embodiment. The MEMS microphone 10 comprises six sensor segments 12 each composed of top, middle and bottom electrodes 31-33. In the circuit arrangement 60 shown in FIG. 8, the top and bottom electrodes 31, 33 of the sectorized sensor cells 30 are connected in parallel and form an input terminal of this sectorized sensor cell 30. The middle electrode 32 of the sectorized sensor cells 30 forms an output terminal of this sectorized sensor cell 30. As shown in FIG. 8, the output terminals of a sectorized sensor cell 30 is then connected to the input terminal of a next sectorized sensor cell such that all sectorized sensor cells 30 of the sensor segments 16 are connected in serial connection to each other.

Figure 9:
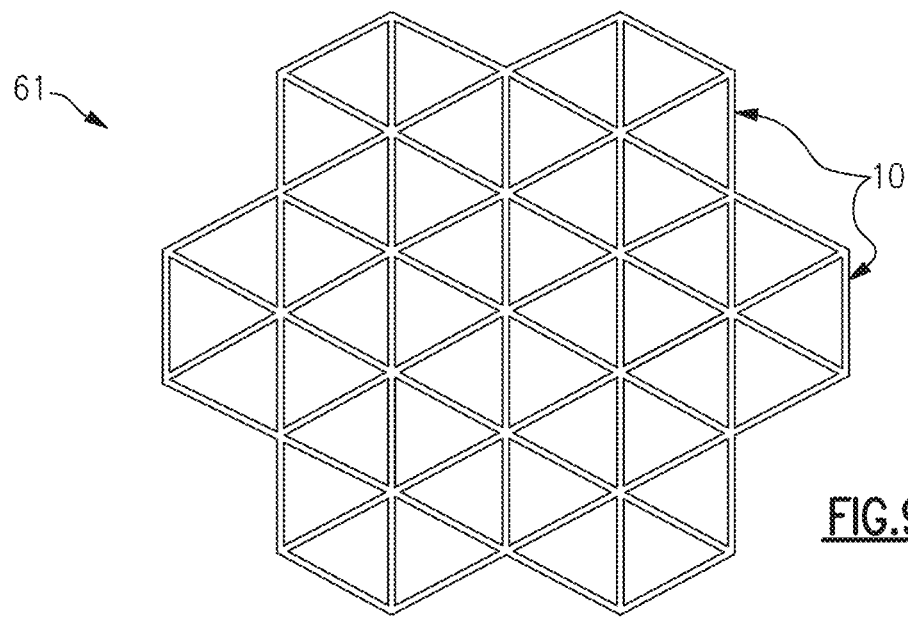
FIG. 9 shows an example of a microphone assembly.

FIG. 9 shows an embodiment of a microphone assembly that is denoted by reference numeral 61. The microphone assembly 61 comprises a plurality of MEMS microphones 10. The MEMS microphones 10 may employ any of the features and principles disclosed herein. The plurality of MEMS microphones 61 are arranged densely without or with minimal gaps side by side in an array-like manner.

Figure 10:
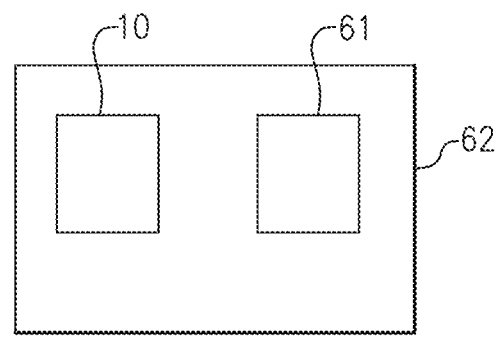
FIG. 10 shows an example of an electronic device.

FIG. 10 shows an example of an electronic device that is denoted by reference numeral 62. The electronic device 62 includes at least one MEMS microphone 10 and/or at least one microphone assembly 61. The MEMS microphones 10 may employ any of the features and principles disclosed herein and the microphone assembly 61 may employ any of the features and principles disclosed with regard to FIG. 9. Amongst others, the electronic device 62 may be a wireless communication device, such as a cellular device.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet-of-Things (NB-IOT), Vehicle-to-Everything (V2X), and High Power User Equipment (HPUE).

3GPP introduced Phase 1 of fifth generation (5G) technology in Release 15 and plans to introduce Phase 2 of 5G technology in Release 16 (targeted for 2019). Subsequent 3GPP releases will further evolve and expand 5G technology. 5G technology is also referred to herein as 5G New Radio (NR).

5G NR supports or plans to support a variety of features, such as communications over millimeter wave spectrum, beam forming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

The principles and advantages of the embodiments as described herein can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 10 GHz, such as in the X or Ku 5G frequency bands.

Figure 11:
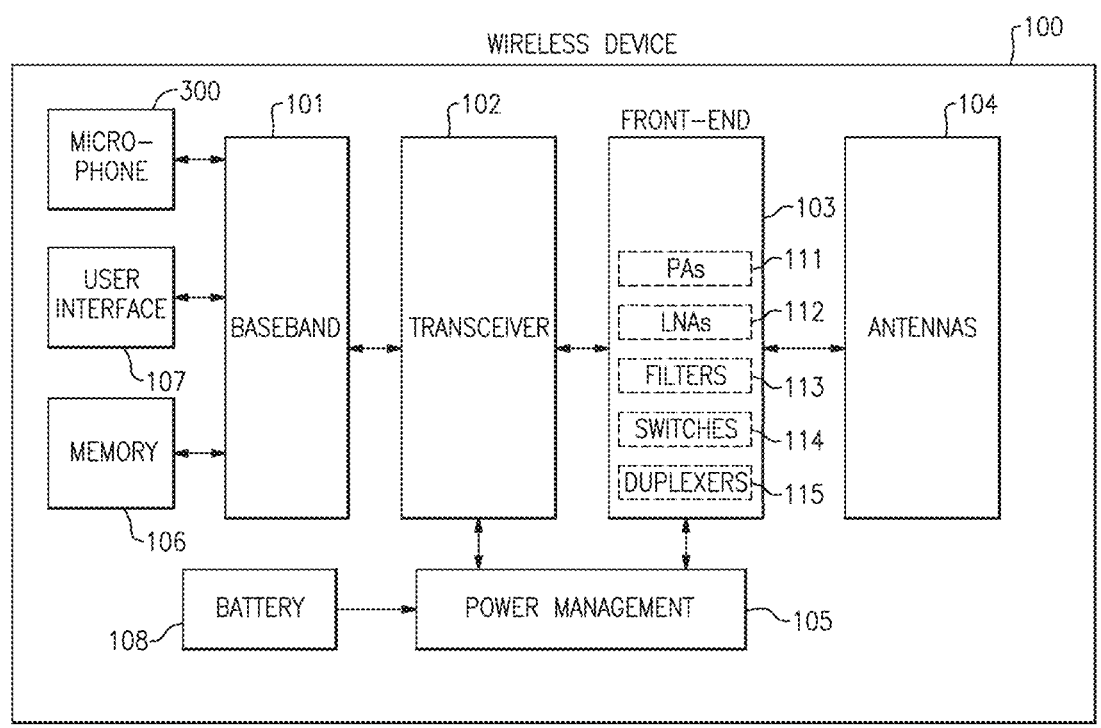
FIG. 11 is a schematic diagram of one embodiment of a wireless device.

FIG. 11 is a schematic diagram of one embodiment of a wireless device 100. The wireless device 100 can be, for example but not limited to, a portable telecommunication device such as a mobile cellular-type telephone. The wireless device 100 can include one or more of a baseband system 101, a transceiver 102, a front end system 103, one or more antennas 104, a power management system 105, a memory 106, a user interface 107, a battery 108 (e.g., direct current (DC) battery), and a microphone 300 (e.g., a piezoelectric MEMS microphone). Other additional components, such as a speaker, display and keyboard can optionally be connected to the baseband system 101. The battery 108 can provide power to the wireless device 100. The microphone 300 can supply signals to the baseband system 101. The microphones 300 may employ any of the features and principles disclosed herein.

It should be noted that, for simplicity, only certain components of the wireless device 100 are illustrated herein. The control signals provided by the baseband system 101 control the various components within the wireless device 100. Further, the function of the transceiver 102 can be integrated into separate transmitter and receiver components.

The wireless device 100 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 102 generates RF signals for transmission and processes incoming RF signals received from the antennas 104. It will be understood that various functionalities associated with the transmission and receiving of RF signals can be achieved by one or more components that are collectively represented in FIG. 11 as the transceiver 102. In one example, separate components (for instance, separate circuits or dies) can be provided for handling certain types of RF signals.

The front end system 103 aids in conditioning signals transmitted to and/or received from the antennas 104. In the illustrated embodiment, the front end system 103 includes one or more power amplifiers (PAs) 111, low noise amplifiers (LNAs) 112, filters 113, switches 114, and duplexers 115. However, other implementations are possible.

For example, the front end system 103 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the wireless device 100 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 104 can include antennas used for a wide variety of types of communications. For example, the antennas 104 can include antennas for transmitting and/or receiving signals associated with a wide variety of frequencies and communications standards.

In certain implementations, the antennas 104 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless device 100 can operate with beamforming in certain implementations. For example, the front end system 103 can include phase shifters having variable phase controlled by the transceiver 102. Additionally, the phase shifters are controlled to provide beam formation and directivity for transmission and/or reception of signals using the antennas 104. For example, in the context of signal transmission, the phases of the transmit signals provided to the antennas 104 are controlled such that radiated signals from the antennas 104 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 104 from a particular direction. In certain implementations, the antennas 104 include one or more arrays of antenna elements to enhance beamforming.

The baseband system 101 is coupled to the user interface 107 to facilitate processing of various user input and output (I/O), such as voice and data. The baseband system 101 provides the transceiver 102 with digital representations of transmit signals, which the transceiver 102 processes to generate RF signals for transmission. The baseband system 101 also processes digital representations of received signals provided by the transceiver 102. As shown in FIG. 11, the baseband system 101 is coupled to the memory 106 of facilitate operation of the wireless device 100.

The memory 106 can be used for a wide variety of purposes, such as storing data and/or instructions to facilitate the operation of the wireless device 100 and/or to provide storage of user information.

The power management system 105 provides a number of power management functions of the wireless device 100. In certain implementations, the power management system 105 includes a PA supply control circuit that controls the supply voltages of the power amplifiers 111. For example, the power management system 105 can be configured to change the supply voltage(s) provided to one or more of the power amplifiers 111 to improve efficiency, such as power added efficiency (PAE).

As shown in FIG. 11, the power management system 105 receives a battery voltage from the battery 108. The battery 108 can be any suitable battery for use in the wireless device 100, including, for example, a lithium-ion battery.

Figure 12A:
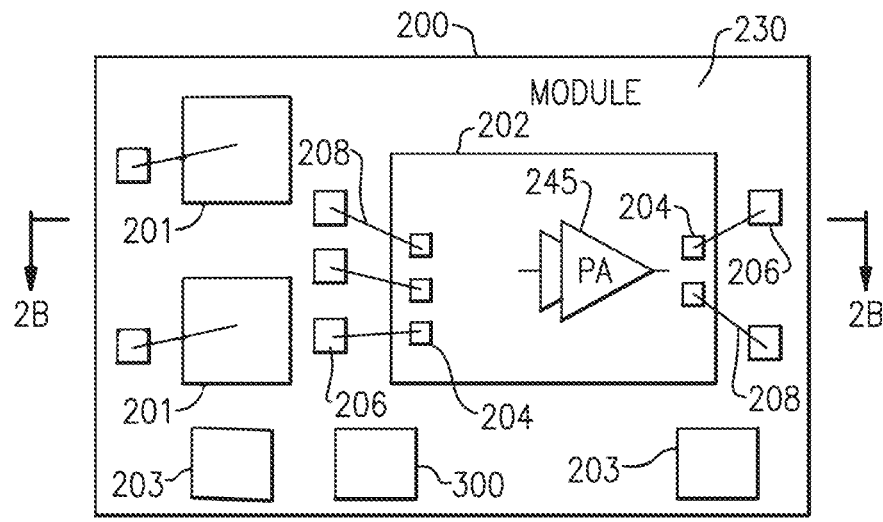
FIG. 12A is a schematic diagram of one embodiment of a packaged module.
Figure 12B:
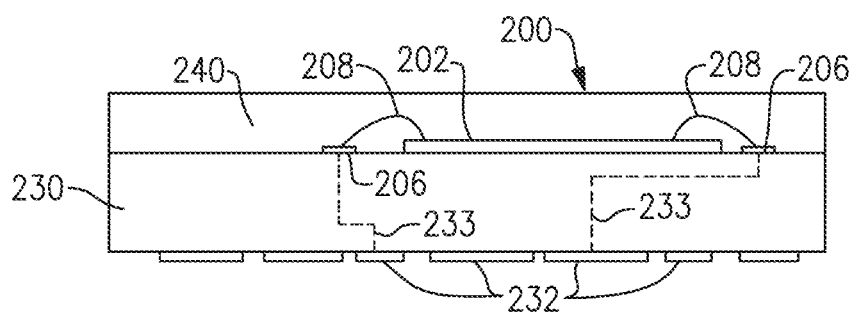
FIG. 12B is a schematic diagram of a cross-section of the packaged module of FIG. 12A taken along the lines 2B-2B.

FIG. 12A is a schematic diagram of one embodiment of a packaged module 200. FIG. 12B is a schematic diagram of a cross-section of the packaged module 200 of FIG. 12A taken along the lines 2B-2B.

The packaged module 200 includes radio frequency components 201, a semiconductor die 202, surface mount devices 203, wirebonds 208, a package substrate 230, and an encapsulation structure 240. One or more of the surface mounted devices (SMDs) 203 can be a microphone 300 (e.g., a piezoelectric MEMS microphone employ any of the features and principles disclosed herein). The package substrate 230 includes pads 206 formed from conductors disposed therein. Additionally, the semiconductor die 202 includes pins or pads 204, and the wirebonds 208 have been used to connect the pads 204 of the die 202 to the pads 206 of the package substrate 220.

The semiconductor die 202 includes a power amplifier 245, which can be implemented in accordance with one or more features disclosed herein.

The packaging substrate 230 can be configured to receive a plurality of components such as radio frequency components 201, the semiconductor die 202 and the surface mount devices 203, which can include, for example, surface mount capacitors and/or inductors. In one implementation, the radio frequency components 201 include integrated passive devices (IPDs).

As shown in FIG. 2B, the packaged module 200 is shown to include a plurality of contact pads 232 disposed on the side of the packaged module 200 opposite the side used to mount the semiconductor die 202. Configuring the packaged module 200 in this manner can aid in connecting the packaged module 200 to a circuit board, such as a phone board of a mobile device. The example contact pads 232 can be configured to provide radio frequency signals, bias signals, and/or power (for example, a power supply voltage and ground) to the semiconductor die 202 and/or other components. As shown in FIG. 2B, the electrical connections between the contact pads 232 and the semiconductor die 202 can be facilitated by connections 233 through the package substrate 230. The connections 233 can represent electrical paths formed through the package substrate 220, such as connections associated with vias and conductors of a multilayer laminated package substrate.

In some embodiments, the packaged module 200 can also include one or more packaging structures to, for example, provide protection and/or facilitate handling. Such a packaging structure can include overmold or encapsulation structure 240 formed over the packaging substrate 230 and the components and die(s) disposed thereon.

It will be understood that although the packaged module 200 is described in the context of electrical connections based on wirebonds, one or more features of the present disclosure can also be implemented in other packaging configurations, including, for example, flip-chip configurations.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed:

1. A microelectromechanical microphone including:
a substrate;
a sensor layer supported by the substrate, the sensor layer including at least two sensing electrodes and at least one piezoelectric layer, the at least two sensing electrodes and the at least one piezoelectric layer stacked together to form a stacked electrode structure, the at least one piezoelectric layer configured to deform and generate an electrical potential responsive to impingement of sound waves on the at least one piezoelectric layer, the at least two sensing electrodes configured to sense the electrical potential, and at least one sensing electrode of the at least two sensing electrodes including first corrugations which are configured such to release residual stress and to improve sensitivity of the microelectromechanical microphone.

2. The microelectromechanical microphone of claim 1 wherein at least one corrugation of the first corrugations extends partially through the at least one sensing electrode.

3. The microelectromechanical microphone of claim 2 where a depth of the at least one corrugation is at least as deep as a width of the at least one corrugation.

4. The microelectromechanical microphone of claim 1 wherein at least one of the first corrugations extends completely through the at least one sensing electrode.

5. The microelectromechanical microphone of claim 1 wherein a width of the first corrugations is between 100 nm and 10 µm.

6. The microelectromechanical microphone of claim 1 wherein the first corrugations are defined as one or more thinned portions within the at least one sensing electrode.

7. The microelectromechanical microphone of claim 1 wherein the first corrugations are arranged at an outer area of the at least one sensing electrode with respect to a center of the sensor layer.

8. The microelectromechanical microphone of claim 1 wherein portions of the sensor layer which are covered by the at least one sensing electrode form an active region of the sensor layer, the first corrugations being provided within a pattern across the active region.

9. The microelectromechanical microphone of claim 8 wherein the pattern represents an array of slit-like trenches or thinned portions.

10. The microelectromechanical microphone of claim 8 wherein the pattern represents an array of crossed-like trenches or thinned portions.

11. The microelectromechanical microphone of claim 8 wherein the active region extends in a ring shape or as a ring section around a center of the sensor layer.

12. The microelectromechanical microphone of claim 11 wherein areas of the sensor layer to which the at least two sensing electrodes to not extend form a passive region of the sensor layer, the microelectromechanical microphone further comprising second corrugations which are provided in the passive region of the sensor layer.

13. The microelectromechanical microphone of claim 1 wherein the sensor layer is attached to the substrate about a perimeter of the sensor layer, and the sensor layer includes a plurality of cantilever-type sensor segments each of which include the stacked electrode structure.

14. The microelectromechanical microphone of claim 1 wherein the microelectromechanical microphone comprises a diaphragm structure.

15. The microelectromechanical microphone of claim 1 wherein each sensing electrode of the at least two sensing electrodes is formed on or below a corresponding piezoelectric electric layer of the at least one piezoelectric layer.

16. A wireless device comprising:

an antenna configured to send and receive wireless signals;

at least one microelectromechanical microphone including a sensor layer, the sensor layer including at least two sensing electrodes and at least one piezoelectric layer, the at least two sensing electrodes and the at least one piezoelectric layer stacked together to form a stacked electrode structure, the at least one piezoelectric layer configured to deform and generate an electrical potential responsive to impingement of sound waves on the at least one piezoelectric layer, the at least two sensing electrodes configured to sense the electrical potential, and at least one sensing electrode of the at least two sensing electrodes including first corrugations which are configured such to release residual stress and to improve sensitivity of the at least one microelectromechanical microphone.

17. A method of forming a piezoelectric microelectromechanical system microphone, the method comprising:

providing a support substrate;

depositing a film of piezoelectric material on the support substrate to form a piezoelectric sensor layer, the piezoelectric sensor layer secured to the support substrate about a perimeter of the piezoelectric sensor layer and including a central region defined within the perimeter that is free to deform and generate an electrical potential responsive to impingement of sound waves on the film of piezoelectric sensor layer;

forming sensing electrodes on one or both of upper and lower surfaces of the piezoelectric sensor layer; and forming first corrugations in at least one first sensing electrode of the sensing electrodes.

18. The method of claim 17 wherein forming the first corrugations includes forming one or more trenches or thinned portions on or in the at least one first sensing electrode.

19. The method of claim 17 wherein at least the first corrugations are produced by employing a wet etch or dry etch process on a surface of a corresponding sensing electrodes.

20. The method of claim 17 wherein at least the first corrugations are produced by diamond sawing or by laser welding a surface of a corresponding sensing electrodes.

* * * * *